US006398041B1

(12) United States Patent
Abbott

(10) Patent No.: US 6,398,041 B1
(45) Date of Patent: Jun. 4, 2002

(54) SNAP SYSTEM FOR RETAINING SLIDE MOUNTED RACK SYSTEM INTO MULTIPLE RACKS WITHOUT TOOLS

(75) Inventor: Ryan C Abbott, Cupertino, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/454,357

(22) Filed: Dec. 3, 1999

(51) Int. Cl.[7] .............................. H02B 1/01; G12B 9/00
(52) U.S. Cl. ...................... 211/26; 248/27.3; 361/829
(58) Field of Search ........................ 211/26; 248/27.1, 248/27.3; 24/615, 616; 361/829

(56) References Cited

U.S. PATENT DOCUMENTS

| 5,231,740 A | * | 8/1993  | Mohebkhosravi | 24/616   |
| 5,262,923 A | * | 11/1993 | Batta et al.  | 361/685  |
| 5,717,570 A | * | 2/1998  | Kikinis       | 361/685  |
| 5,833,337 A | * | 11/1998 | Kofstad       | 211/175 X|
| 6,021,047 A | * | 2/2000  | Lopez et al.  | 361/727  |
| 6,099,098 A | * | 8/2000  | Leong         | 312/333  |
| 6,123,203 A | * | 9/2000  | Gibbons       | 211/26   |
| 6,141,209 A | * | 10/2000 | Kerrigan et al.| 361/683 |

* cited by examiner

Primary Examiner—Daniel P. Stodola
Assistant Examiner—Erica B. Harris
(74) Attorney, Agent, or Firm—Manuel Quiogue

(57) ABSTRACT

A latch for retaining a rack slide mounted computer in a rack system. The latch includes a resiliently bendable latch arm having catches configured for engagement with a column flange of a computer rack system.

8 Claims, 6 Drawing Sheets

SNAP SYSTEM FOR RETAINING SLIDE MOUNTED RACK SYSTEM INTO MULTIPLE RACKS WITHOUT TOOLS

BACKGROUND OF THE INVENTION

The disclosed invention relates generally to electronic equipment rack systems, and more particularly to an easily releasable rack slide retention system.

An electronic equipment rack system is an equipment supporting structure that includes four vertically oriented support columns or rails, each having a plurality of apertures. The support columns are fixedly located relative to each other so as to be at the corners of a rectangle, whereby two support columns are at a front of the rack system while two support columns are at a rear of the rack system. Thus, each of left and right sides of the rack system includes a front support column and a rear support column.

A left side slide assembly and a right side slide assembly are mounted horizontally opposite and parallel to each other on the left and right sides of the rack system to support a piece of electronic equipment to be installed in the rack system. Such left and right slide assemblies extend back to front, and include respective slidable support panels that are attachable to an enclosure or chassis of the electronic equipment being supported in the rack system. The electronic equipment is thus slidably supported in the rack system, typically so that the electronic equipment can be slid forwardly for access.

In order to prevent unwanted sliding of the rack slide supported electronic equipment, the equipment chassis is secured to the rack system by a slide retention mechanism, for example by thumb screws or standard screws that pass through brackets attached to the electronic equipment chassis.

Considerations with known mechanisms for retaining rack slide mounted electronic equipment include difficulty of use as well as difficulty in ascertaining how to release the slide retention mechanism. Another consideration is the possibility that the retention mechanism is not engaged after the electronic equipment is slid into the rack system.

There is accordingly a need for an easy to use and reliable rack slide retention system.

SUMMARY OF THE INVENTION

The disclosed invention is directed to a rack slide retention mechanism that includes a latch arm having a catch for engaging a column flange of a rack system support column.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
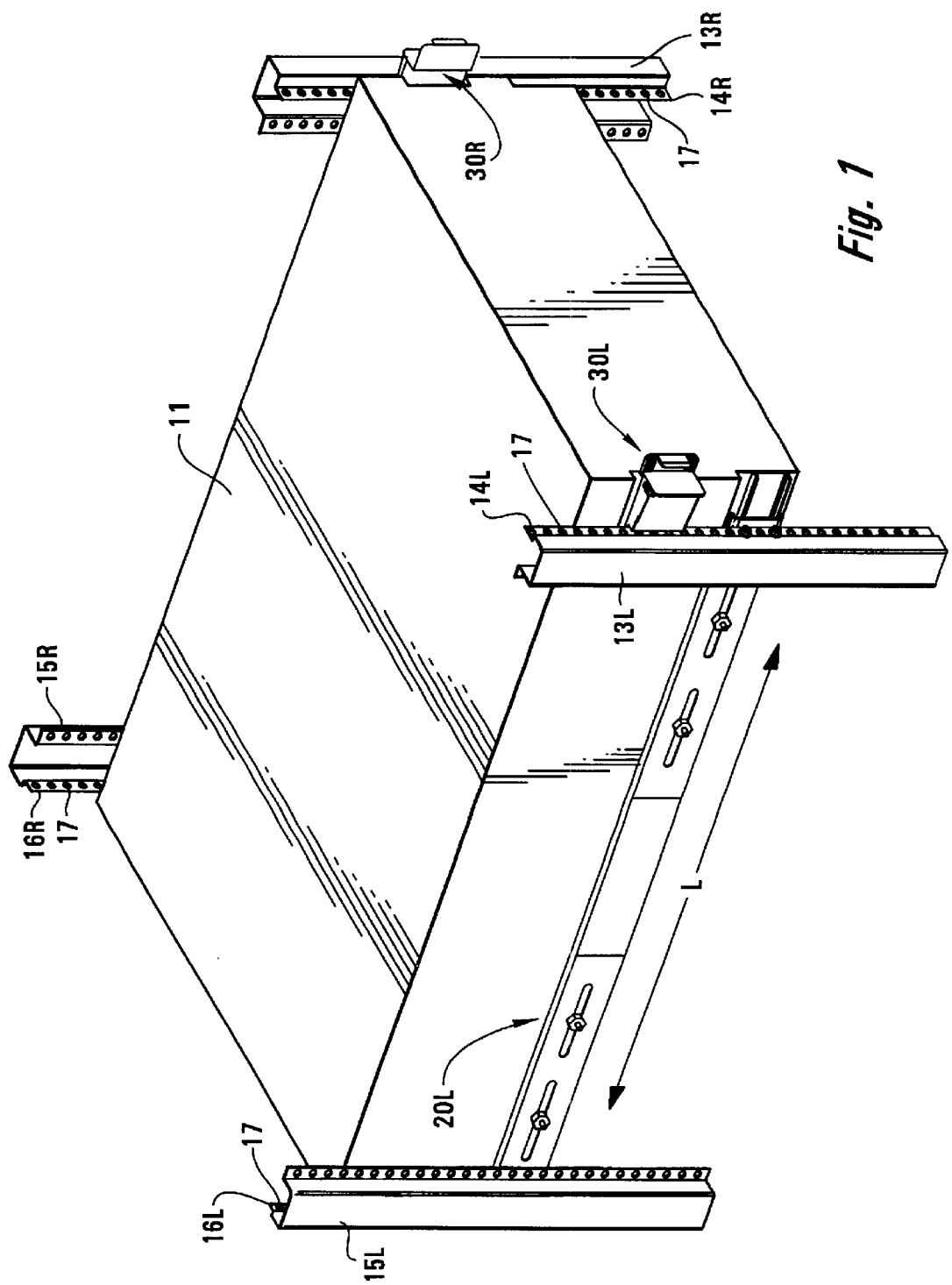
FIG. 1 is a schematic isometric view of a computer equipment rack system that employs rack slide retention mechanisms in accordance with the invention.

In the following detailed description and in the several figures of the drawing, like elements are identified with like reference numerals.

Referring now to the FIG. 1, set forth therein is a schematic perspective view of a rack system 10 that incorporates a rack slide retention mechanism in accordance with the invention. The rack system 10 more particularly includes front columns 13L, 13R and rear columns 15L, 15R. The front columns 13L, 13R respectively include left and right front column flanges 14L, 14R in which are formed apertures 17, while the rear columns 15L, 15R respectively include left and right rear column flanges 16L, 16R in which are formed apertures 17. Conventionally, the front column flanges 14L, 14R are coplanar, and the rear column flanges 16L, 16R are coplanar. Also conventionally, the column flanges when viewed from above are located at the vertexes of a rectangle.

A computer equipment chassis or enclosure 11 is conventionally supported in the rack system by a left slide assembly 20L and a right slide assembly (not shown) that are respectively installed between the left front and rear column flanges 14L, 16L and between the right front and rear column flanges 14R, 16R of a respective side of the rack system. The slide assemblies thus allow the computer equipment enclosure 11 to be slidably moved along a longitudinal slide axis L.

In accordance with the invention, left and right latches 30L, 30R are respectively attached to sides of the computer equipment chassis 11 for selective engagement with the left and right front column flanges 14L, 14R. In particular, the left and right latches 30L, 30R include respective catches that engage the column flanges when the computer equipment chassis 11, as supported by the rack slides, is pushed into the rack system. The latches are manually actuated to disengage them from the column flanges so that the computer equipment chassis 11 can be pulled out of the interior of the rack system.

The latches 30L and 3OR are mirror images of each other, and the left latch 30L will described as being representative of both latches.

Figure 2:
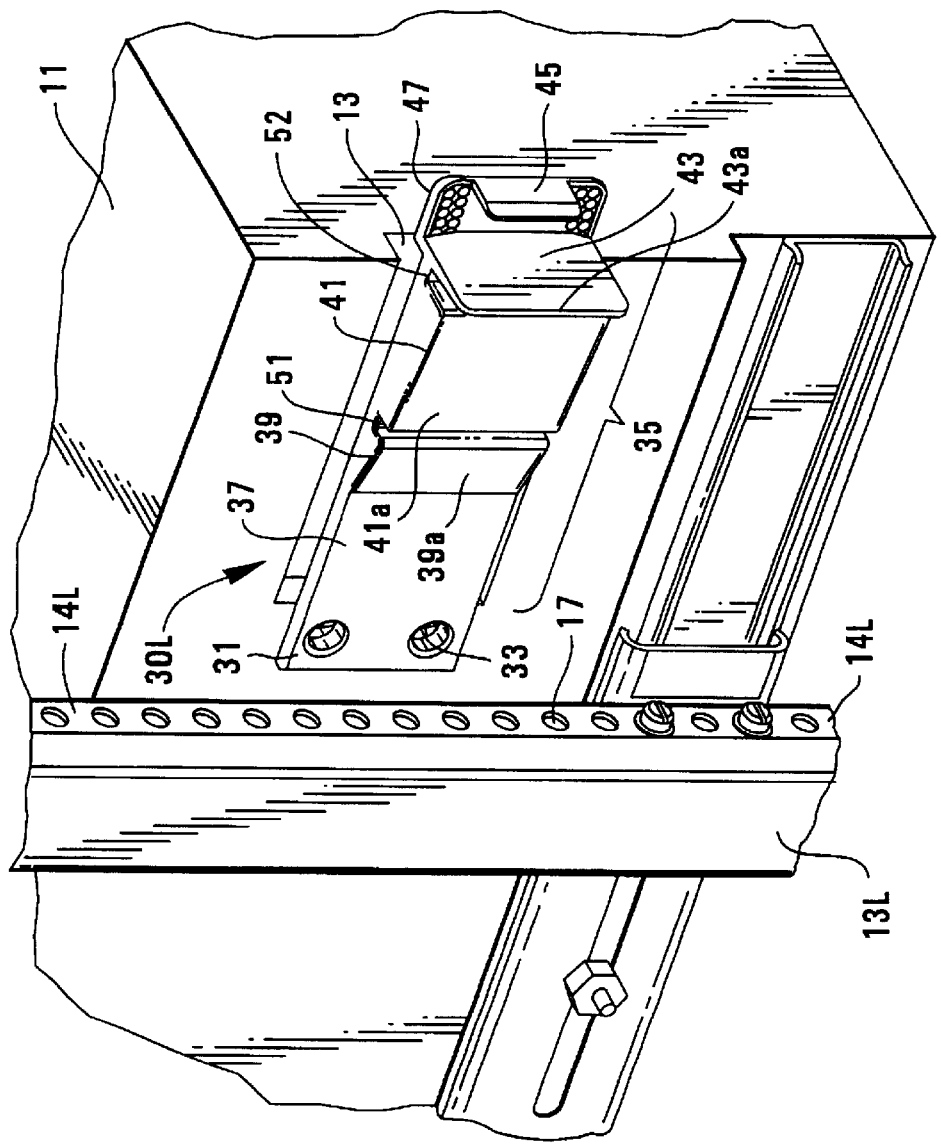
FIG. 2 is a schematic isometric view of a rack slide latch in accordance with the invention.

Referring more particularly to FIG. 2, the latch 30L comprises a resiliently bendable cantilever latch arm having one end 31 that is secured to the left side of the computer enclosure 11, for example by screws 33, and an unsupported portion 35 that extends toward the front of the enclosure along the longitudinal slide axis L and over an indentation 13 in the computer chassis or enclosure 11. The unsupported portion 35 of the latch arm 30L includes a flat portion 37 and a first slot or catch 51 that is formed by a gap or slot between a first wedge shaped block 39 and a second wedge shaped block 41. A stop flange 43 is separated from the second wedge shaped block 41 by a second catch notch or slot 52, and a latch actuating tab 45 is connected to the stop flange 43 by an extension 47.

Generally, the catches 51, 52 are located at different locations along the longitudinal slide axis L and are formed by a first block 39, a second block 41, and a stop flange 43 that are serially located along the longitudinal slide axis L and separated by slots that form the catches.

The first wedge shaped block 39 more particularly includes a ramp surface 39a that ramps outwardly (laterally from the enclosure) from an outer surface of the flat portion 37, and the second wedge shaped block 41 more particularly includes a ramp surface 41a that ramps further outwardly relative to the ramp surface 39a of the first wedge shaped block 41. The stop flange 43 extends outwardly beyond the adjacent ramp surface 41a of the raised rectangular block 39 such that a top edge 43a of the stop flange 43 is further outward than such adjacent ramp surface 41a.

The latch 30L and the indentation 13 are dimensioned so that the flat portion 37 will clear the column flange 14L when the enclosure 11 is moved into the rack system, and so that the unsupported portion 35 of the latch 30L can be sufficiently deflected inwardly to allow the first and second wedge shaped blocks 39, 41 to clear the column flange 14L so that one of the notches 51, 52 can engage the column flange 14L.

Generally, one of the catch notches 51, 52 of the latch 30L and a corresponding catch notch in the right latch 30R are respectively engaged with the left front column flange 14L and the right column flange 14R to prevent the enclosure 11 from sliding. The latches are disengaged from the column flanges 14L, 14R by depressing the actuator tabs 45 inwardly toward the computer enclosure 11 by a sufficient amount to allow the computer enclosure to be pulled forwardly, for example by pulling on the actuator tabs 45.

Figure 3:
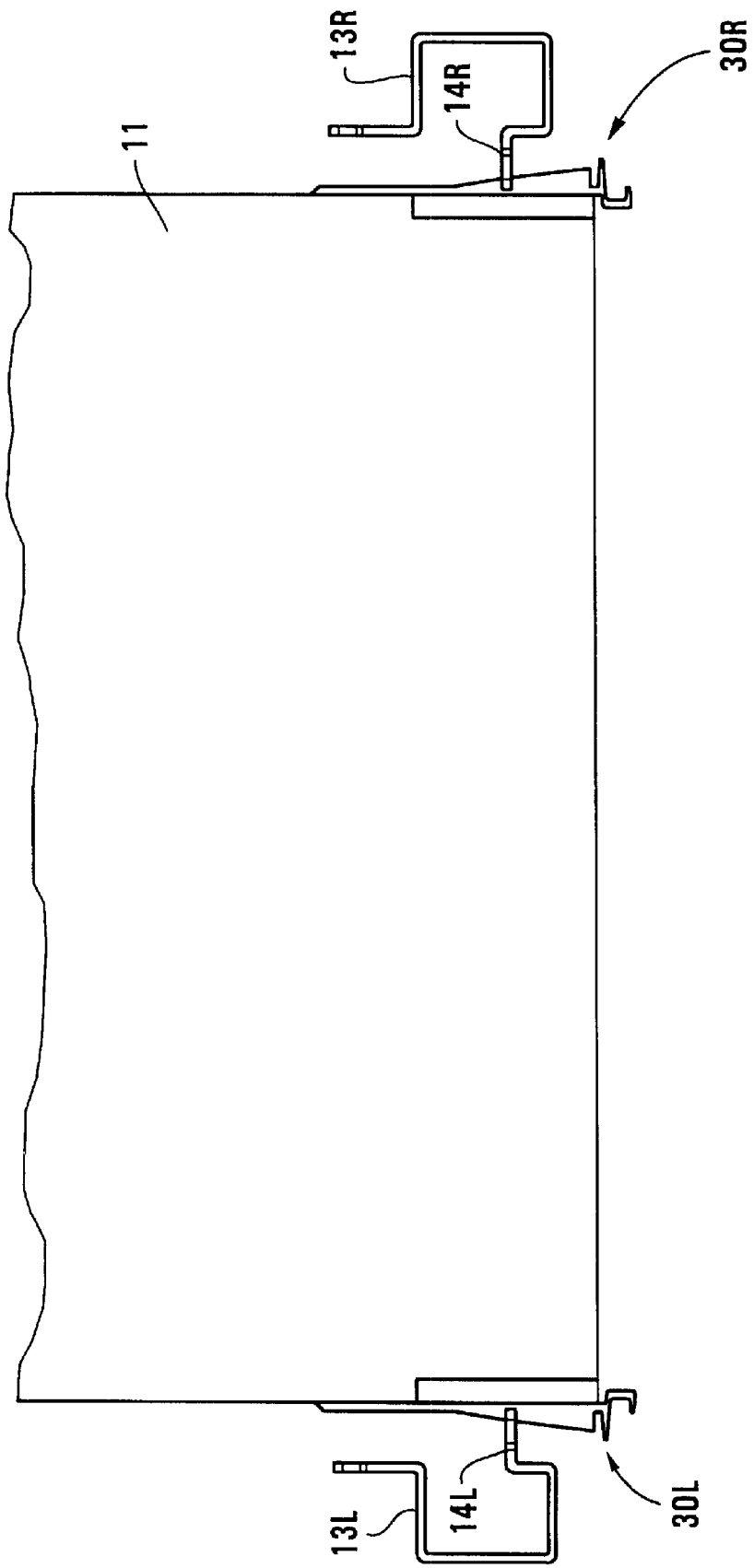
FIG. 3 is a schematic plan view illustrating engagement of a first catch of the rack slide latch of FIG. 2 with a column flange of a rack system.
Figure 4:
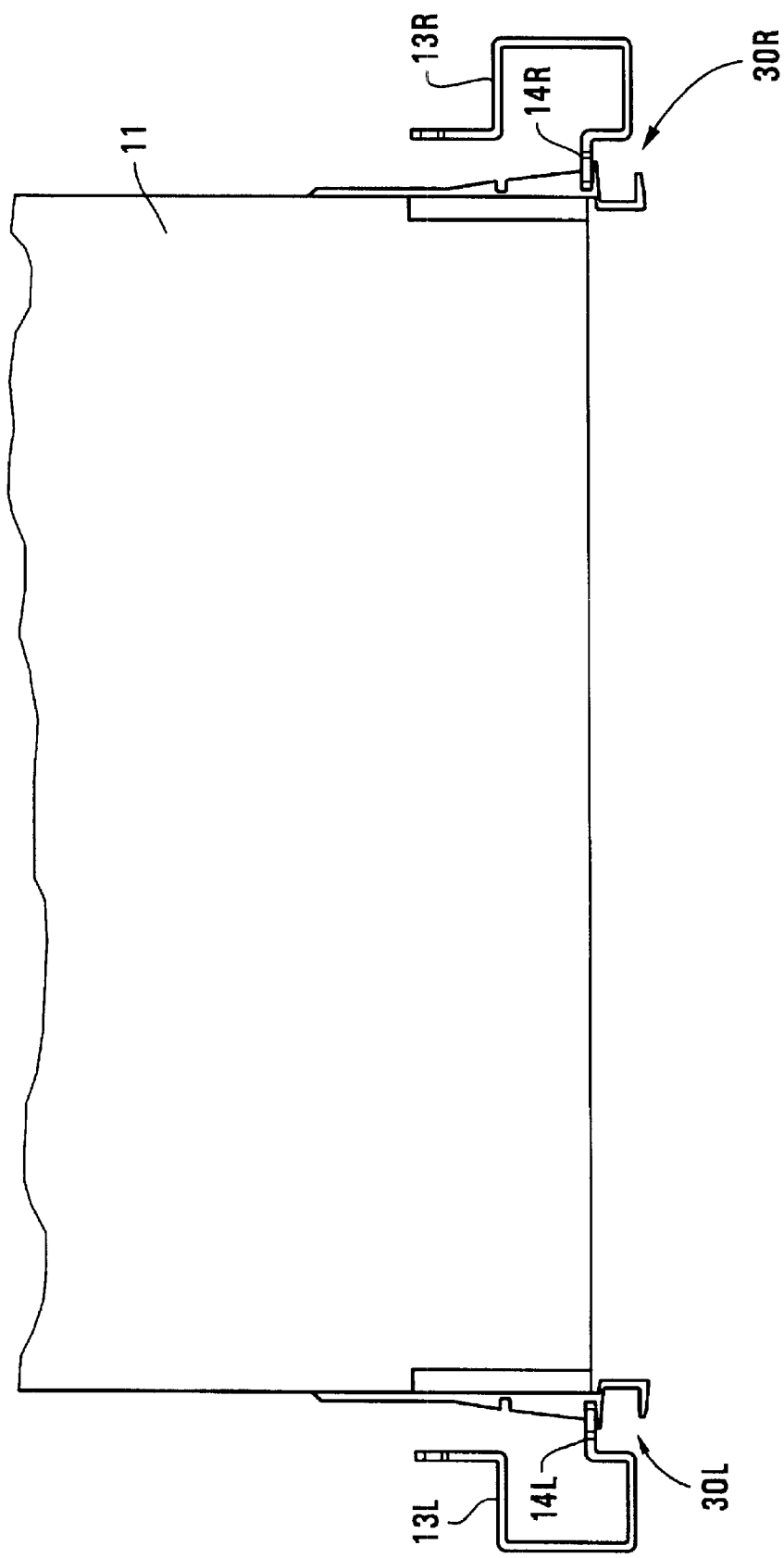
FIG. 4 is a schematic plan view illustrating engagement of a second catch of the rack slide latch of FIG. 5 is a schematic isometric view of another rack slide latch in accordance with the invention.

When the computer enclosure 11 is pushed back into the rack system, the ramped surface of each first wedge shaped block 39 slides against the respective column flange 14L, 14R and causes the latch arm 31 to deflect inwardly until the first catch slot 51 of each latch arm snaps onto and engages the respective column flange 14L, 14R, as shown in FIG. 3. If the computer enclosure 11 is installed in a rack system wherein it is intended that the computer enclosure be situated further in the rack system, the user presses in the latch actuating tabs 45 and pushes the computer enclosure 11 further into the rack system to engage the second catch slots 52, as shown in FIG. 4.

Figure 5:
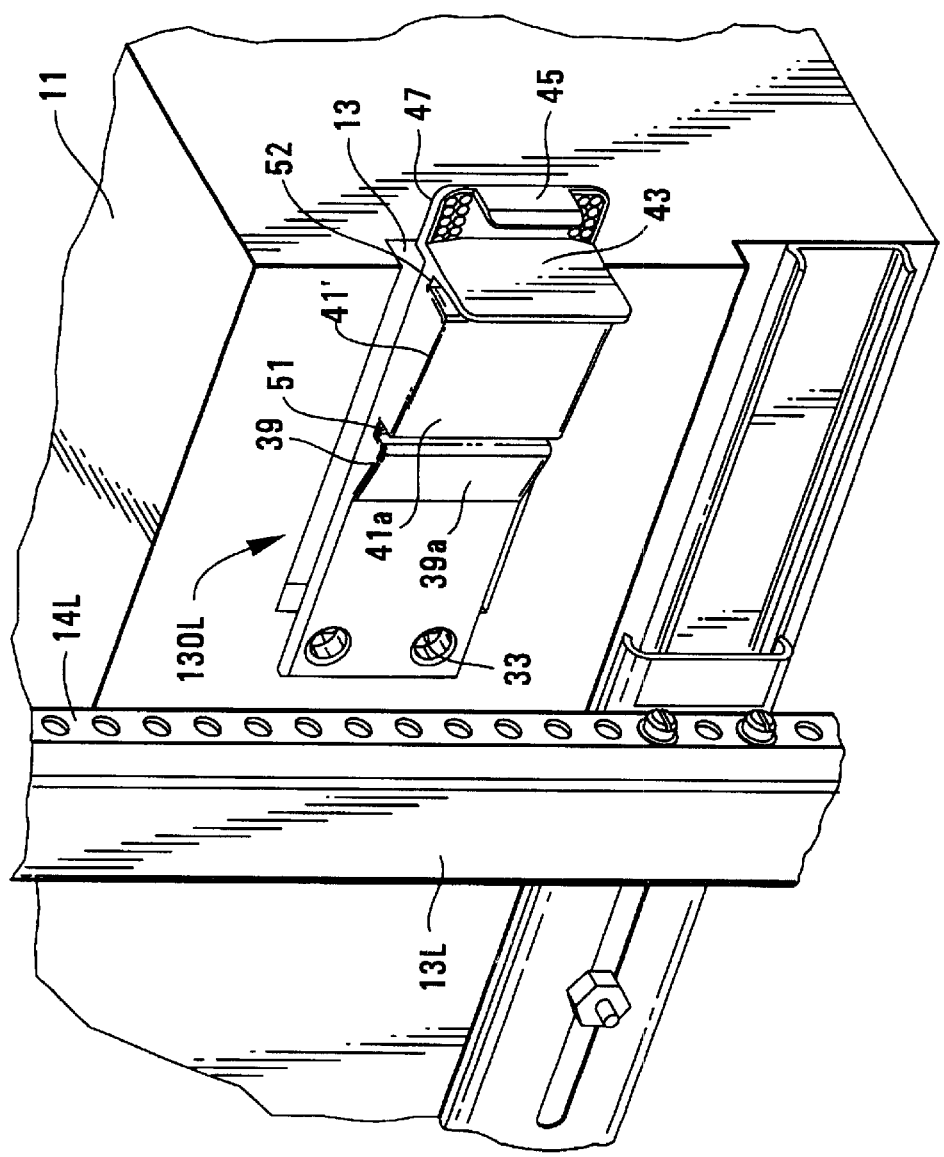
Figure 6:
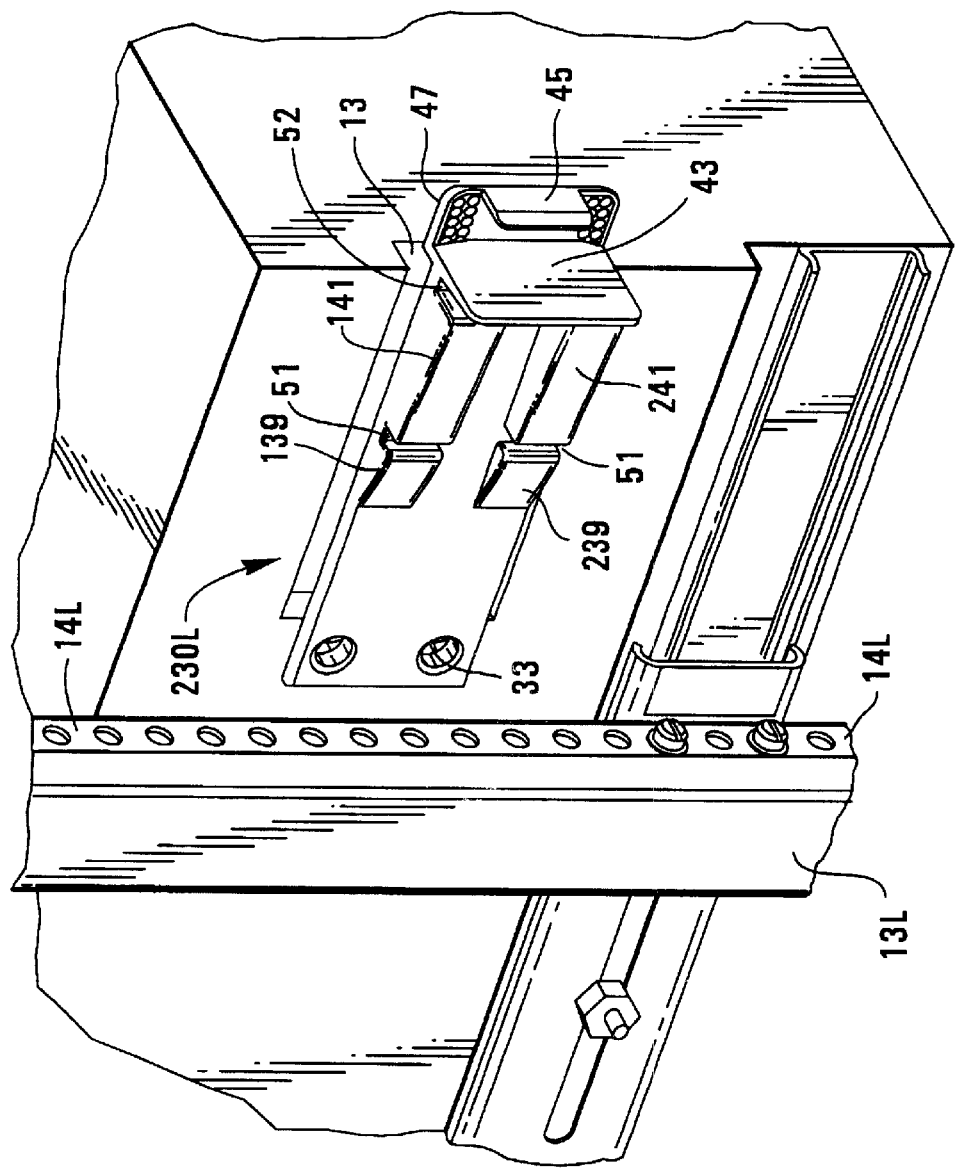
FIG. 6 is a schematic isometric view of a further rack slide latch in accordance with the invention.

The latch of the invention can be implemented alternatively with a rectangularly shaped, non-ramped block 41' instead of the second wedge shaped block 41, as shown in FIG. 5 for a latch 130L. As another alternative, as shown in FIG. 6, a latch 230L can employ a first pair of substantially identical wedge shaped blocks 139, 239 that are side by side transversely to the longitudinal slide axis L, and a second pair of identically shaped wedge shaped blocks 141, 241 that are side by side transversely to the longitudinal axis L. The first catch slot 51 is between the first pair of wedge shaped blocks 139, 239 and the second pair of wedge shaped blocks 141, 241, while the second catch slot 52 is between the second pair of wedge shaped blocks 141, 241 and the stop flange 43.

By way of illustrative example, each of the latches 30L, 30R comprises a unitary integrally formed, resiliently bendable structure made of a suitable plastic.

The disclosed rack slide retention mechanism thus includes a latch that advantageously eliminates the need for a tool to release a slide mounted chassis, which makes servicing the slide mounted chassis easier, and is simple and intuitive to use. The disclosed rack slide mechanism cooperates with known rack systems to retain slide mounted computer enclosures in a rack system, and further includes two catches that allows for installation in rack systems of different depths.

Although the foregoing has been a description and illustration of specific embodiments of the invention, various modifications and changes thereto can be made by persons skilled in the art without departing from the scope and spirit of the invention as defined by the following claims.

What is claimed is:

1. Apparatus for latching a computer enclosure in a rack system, the computer enclosure being attached to a rack slide so as to be slidable along a slide axis, comprising:

an arm having a predetermined end adapted for attachment to the computer enclosure, said arm being offset from the rack slide transversely to the slide axis;

a first catch disposed on said arm forwardly of said predetermined end of said arm, said first catch comprising a slot formed between a first block and a second block;

a second catch disposed on said arm forwardly of said first catch, said second catch comprising a slot formed between said second block and a stop tab; and said first catch and said second catch configured to engage a column flange of a rack system in which the computer enclosure is installed, whereby the apparatus can be used with rack systems of different depths without changing the attachment of said arm to the computer enclosure.

2. The apparatus of claim 1 wherein said first block comprises a first wedge shaped block, and wherein said second block comprises a second wedge shaped block.

3. The apparatus of claim 2 wherein said second wedge shaped block extends further outwardly than said first wedge shaped block.

4. The apparatus of claim 3 wherein said stop tab extends further outwardly than said second block.

5. Computer equipment apparatus adapted to be supported in a rack system by a rack slide so as to be slidable along a slide axis, comprising:

a computer enclosure;

an arm having a predetermined end attached to the computer enclosure so as to have an unsupported portion disposed forwardly of said predetermined end;

an indentation in said computer enclosure adjacent said arm for accomodating deflection of said unsupported portion into said indentation;

a first catch disposed on said arm forwardly of said predetermined end of said arm, said first catch comprising a slot formed between a first block and a second block;

a second catch disposed on said arm forwardly of said first catch, said second catch comprising a slot formed between said second block and a stop tab; and said first catch and said second catch configured to engage a column flange of a rack system in which the computer equipment apparatus is installed, whereby the computer equipment apparatus can be used with rack systems of different depths without changing the attachment of said arm to said computer enclosure.

6. The apparatus of claim 5 wherein said first block comprises a first wedge shaped block, and wherein said second block comprises a second wedge shaped block.

7. The apparatus of claim 6 wherein said second wedge shaped block extends further outwardly than said first wedge shaped block.

8. The apparatus of claim 7 wherein said stop tab extends further outwardly than said second block.

* * * * *